United States Patent
Jamison et al.

(10) Patent No.: US 9,053,926 B2
(45) Date of Patent: Jun. 9, 2015

(54) CYCLICAL PHYSICAL VAPOR DEPOSITION OF DIELECTRIC LAYERS

(71) Applicants: International Business Machines Corporation, Armonk, NY (US); CANON ANELVA CORPORATION, Kanagawa (JP)

(72) Inventors: Paul Jamison, Hopewell Junction, NY (US); Juntao Li, Guilderland, NY (US); Vamsi Paruchuri, Clifton Park, NY (US); Tuan A. Vo, Albany, NY (US); Takaaki Tsunoda, Albany, NY (US); Sanjay Shinde, San Ramon, CA (US)

(73) Assignees: International Business Machines Corporation, Armonk, NY (US); Canon Anelva Corporation, Kanagawa (JP)

( * ) Notice: Subject to any disclaimer, the term of this patent is extended or adjusted under 35 U.S.C. 154(b) by 117 days.

(21) Appl. No.: 13/845,385

(22) Filed: Mar. 18, 2013

(65) Prior Publication Data

US 2014/0273425 A1 Sep. 18, 2014

(51) Int. Cl.
*H01L 21/8239* (2006.01)
*H01L 21/02* (2006.01)
*H01L 21/28* (2006.01)
(Continued)

(52) U.S. Cl.
CPC .... *H01L 21/02186* (2013.01); *H01L 21/02181* (2013.01); *H01L 21/28008* (2013.01); *H01L 29/517* (2013.01); *H01L 21/823857* (2013.01); *H01L 21/28194* (2013.01); *H01L 21/02244* (2013.01)

(58) Field of Classification Search
CPC ............ H01L 23/53295; H01L 29/517; H01L 21/28194; H01L 21/823857; H01L 21/28202; C03C 16/405

USPC .................. 438/199, 216, 287, 591, 778, 785
See application file for complete search history.

(56) References Cited

U.S. PATENT DOCUMENTS 6,514,828 B2  2/2003  Ahn et al.
6,661,058 B2  12/2003  Ahn et al.
(Continued)

FOREIGN PATENT DOCUMENTS

JP         2003224268       8/2003
KR    10-20020003003       1/2002

OTHER PUBLICATIONS

Yamamoto et al., "Electrical and Physical Characterization of Remote Plasma Oxidized HfO2 Gate Dielectrics", IEEE Transactions on Electron Devices, vol. 53, Nov. 5, May 2006.
Aygun et al., "Effects of Physical Growth Conditions on the Structural and Optical Properties of Sputtered Grown Thin HfO2 Films", Thin Solid Films, 2010 Elsevier B.V.
Huang et al., "Device and Reliability Improvement of HfSiON+LaOx/Metal Gate Stacks for 22nm Node Application", Sematech, Austin, TX 78741.
(Continued)

*Primary Examiner* — Thanhha Pham
(74) *Attorney, Agent, or Firm* — Steven M. Kellner; Yuanmin Cai

(57) ABSTRACT

Embodiments include methods of forming dielectric layers. According to an exemplary embodiment, a dielectric layer may be formed by determining a desired thickness of the dielectric layer, forming a first dielectric sub-layer having a thickness less than the desired thickness by depositing a first metal layer above a substrate and oxidizing the first metal layer, and forming n (where n is greater than 1) additional dielectric sub-layers having a thickness less than the desired thickness above the first dielectric sub-layer by the same method of the first dielectric sub-layer so that a combined thickness of all dielectric sub-layers is approximately equal to the desired thickness.

17 Claims, 4 Drawing Sheets

(51) Int. Cl.
 *H01L 29/51* (2006.01)
 *H01L 21/8238* (2006.01)

(56) References Cited

U.S. PATENT DOCUMENTS

| | | | |
|---|---|---|---|
| 6,767,795 | B2 | 7/2004 | Ahn et al. |
| 7,205,620 | B2 | 4/2007 | Ahn et al. |
| 7,560,793 | B2 | 7/2009 | Derderian et al. |
| 2002/0155688 | A1 | 10/2002 | Ahn et al. |
| 2002/0155689 | A1 | 10/2002 | Ahn et al. |
| 2003/0113972 | A1* | 6/2003 | Hayashi et al. ........... 438/287 |
| 2007/0026608 | A1* | 2/2007 | Choi et al. ............... 438/257 |

OTHER PUBLICATIONS

Rudenja et al., "Low-Temperature Deposition of Stoichiometric HfO2 on Silicon: Analysis and Quantification of the HfO2/Si Interface From Electrical and XPS Measurements", Applied Surface Science 257 (2010).

Kirsch et al., "Electrical and Spectroscopic Comparison of HfO2/Si Interfaces on Nitrided and Un-Nitrided Si (100)", Journal of Applied Physics, Published by the American Institue of Physics, Nov. 2011.

* cited by examiner

US 9,053,926 B2

CYCLICAL PHYSICAL VAPOR DEPOSITION OF DIELECTRIC LAYERS

BACKGROUND

The present invention generally relates to gate dielectrics of field effect transistors, and particularly to methods of forming a gate dielectric using a cyclical physical vapor deposition (PVD) process.

Metal-oxide-semiconductor (MOS) technology is a commonly used technology for fabricating field effect transistors (FETs) as part of advanced integrated circuits, such as CPUs, memory, and storage devices, and the like. In MOS technology, a FET may be formed by depositing a gate structure over a channel region connecting a source and a drain. For planar FETs, the channel region is formed in a semiconductor substrate on which the gate structure is formed. In finFETs, the gate structure may be formed over or around a semiconductor fin or fins on an insulator layer, with a source and a drain formed on opposite ends of the semiconductor fin(s).

In MOS technology, the gate structure may be made of a gate dielectric and a gate electrode. In traditional MOS-FETs, the gate dielectric consists of a silicon oxide layer intended in part to prevent current from leaking from the gate electrode into the channel. However, as the critical dimensions of modern microelectronic structures continues to decrease, silicon oxide gate dielectrics may not be reliably used as gate dielectrics due in part to fabrication limits. Therefore, an increasing trend in microelectronic device fabrication is to at least partially replace the silicon dioxide gate dielectric with a high-k dielectric, such as, strontium titanium oxide, hafnium oxide, hafnium silicon oxide, aluminum oxide or zirconium oxide. These high-k dielectrics may be reliably fabricated with thicknesses much greater than a silicon dioxide layer while maintaining approximately the same ability to prevent leakage.

Typically, high-k dielectrics are formed using atomic layer deposition (ALD). However, ALD has a number of disadvantages compared to PVD, potentially including lower growth rate, greater concentration of impurities, and cost of ownership. However, PVD of a high-k dielectric often results in trapped charges within the dielectric layer. Therefore, a process of forming a high-k dielectric layer using PVD that reduces the likelihood of trapped charges is desirable.

BRIEF SUMMARY

The present invention relates to forming gate dielectric layers using a cyclical physical vapor deposition process. According to an exemplary embodiment, a dielectric layer may be formed by determining a desired thickness of the dielectric layer, forming a first dielectric sub-layer having a thickness less than the desired thickness by depositing a first metal layer above a substrate and oxidizing the first metal layer, and forming n (where n is greater than 1) additional dielectric sub-layers having a thickness less than the desired thickness above the first dielectric sub-layer by the same method of the first dielectric sub-layer so that a combined thickness of all dielectric sub-layers is approximately equal to the desired thickness According to another exemplary embodiment, a gate dielectric may be formed by determining a thickness appropriate for the gate dielectric, forming a first dielectric sub-layer by depositing a first metal layer above a substrate and oxidizing the first metal layer, forming another dielectric sub-layer above the first dielectric sub-layer by depositing another metal layer above the first dielectric sub-layer and oxidizing the another metal layer, determining if a total thickness of all dielectric sub-layers has reached the thickness appropriate for the gate dielectric, and, if not, then repeating forming another dielectric sub-layer to form additional dielectric sub-layers until the total thickness of all dielectric sub-layers reaches the thickness appropriate for the gate dielectric.

Figure 1:
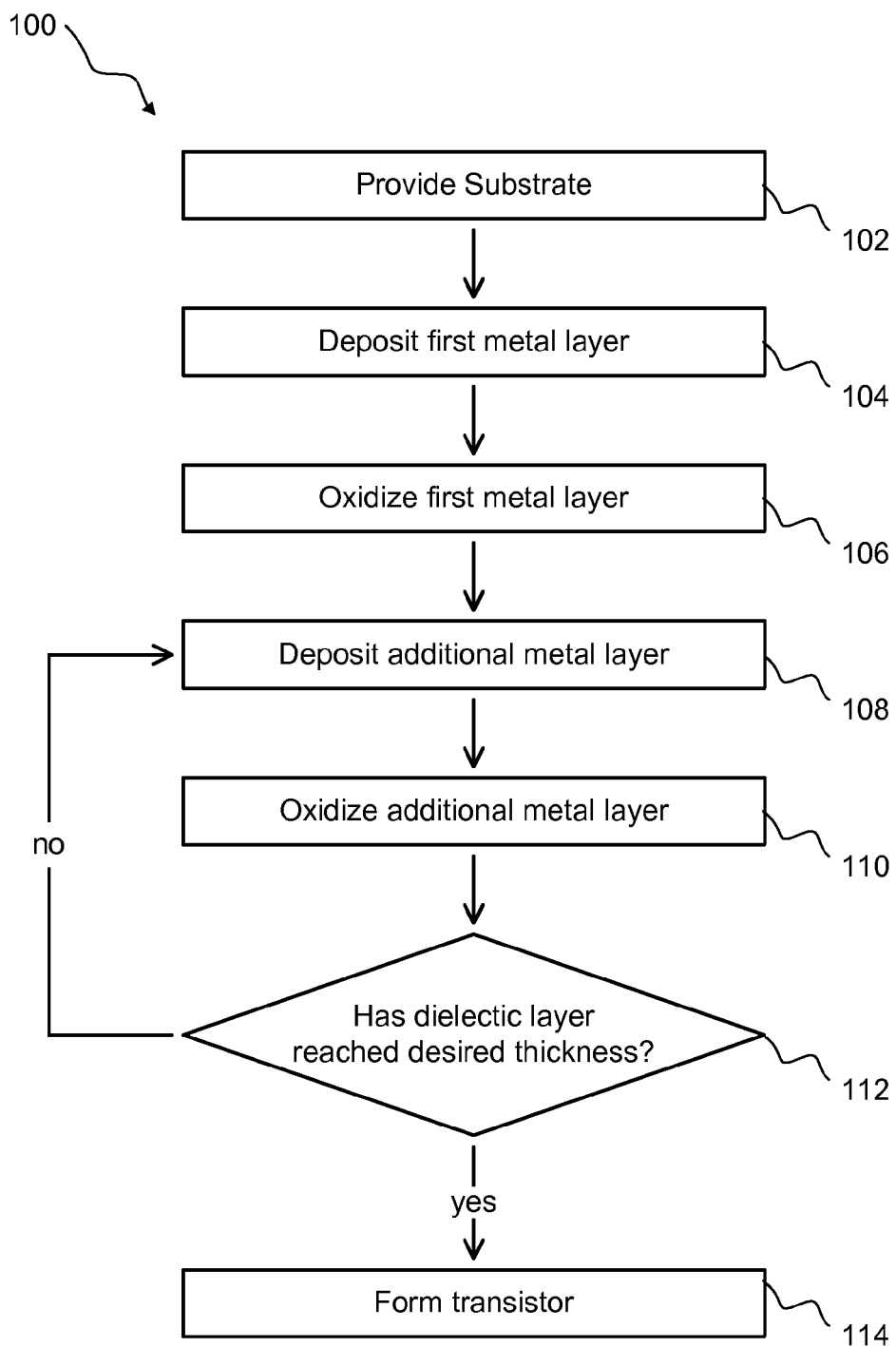
FIG. 1 is a flow diagram of a method of fabricating a semiconductor structure, according to an exemplary embodiment of the present invention.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Referring to FIG. 1, a flow diagram 100 of a method of forming a dielectric layer with a desired thickness is illustrated. The flow diagram 100 of FIG. 1 may be described with the aid of the structures illustrated in FIGS. 2-9.

Figure 2:
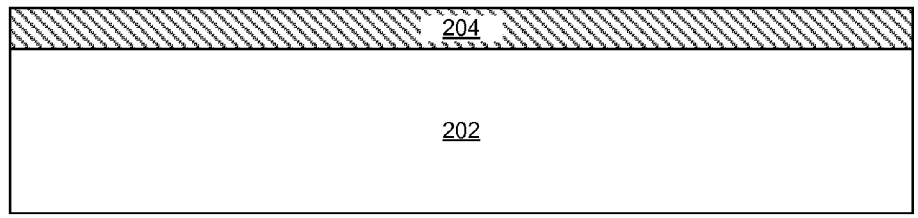
FIG. 2 is a cross-sectional front elevational view depicting a semiconductor substrate, according to an exemplary embodiment of the present invention.

At 102, described in conjunction with FIG. 2, a substrate 202 may be provided. The substrate 202 may be made of any semiconductor material including, but not limited to: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the substrate 202 may be about, but is not limited to, several hundred microns thick. For example, the substrate 202 may include a thickness ranging from 0.5 mm to about 1.5 mm. The substrate 202 may also include isolation regions to isolate the depicted transistor structure from adjacent structures (not shown). The isolation regions may be formed by any known method in the art, including, for example, etching into the substrate 202 to form trenches, and then filling the trenches with an insulating material, such as silicon dioxide. Other embodiments may include other means of isolating structures formed on the substrate 202, or may have isolation around only some of, or none of, the structures. Further, the substrate 202 may be a semiconductor-on-insulator (SOI) substrate, where the substrate 202 contains a buried insulator layer to isolate structures formed on the substrate 202.

In some embodiments, an interfacial layer 204 may be formed above the substrate 202. The interfacial layer 204 may be formed by thermally oxidizing a top portion of the substrate 202. In other embodiments, the interfacial layer 204 may be formed by depositing an insulating layer, for example silicon oxide or silicon oxynitride (preferably with a low nitrogen ratio), above the substrate 202 using known deposition techniques including, for example, chemical vapor deposition (CVD) or atomic layer deposition (ALD). The interfacial layer 204 may have a thickness of approximately 0.3 nm to approximately 1.2 nm.

Figure 3:
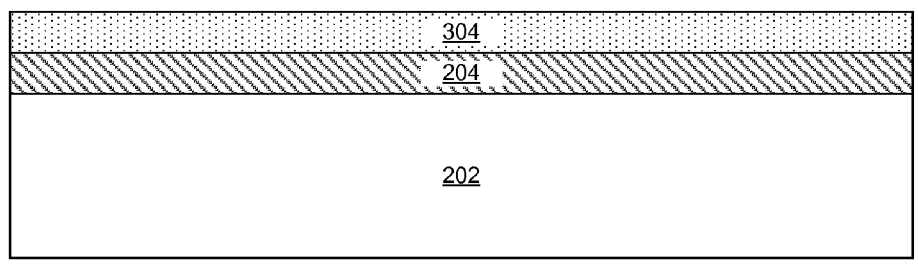
FIG. 3 is a cross-sectional front elevational view depicting forming a first metal layer above the semiconductor substrate, according to an exemplary embodiment of the present invention.

At 104, described in conjunction with FIG. 3, a first metal layer 304 may be deposited above the interfacial layer 204, if present, or above the substrate 202 in embodiments without an interfacial layer. The first metal layer 304 may be made of any suitable metal material capable of forming a dielectric layer following oxidation including, for example, hafnium or titanium, and may be thin enough that it may be fully oxidized by the oxidation process described below at 106. In an exemplary embodiment, the first metal layer 304 may be made of hafnium and may have a thickness of approximately 0.08 nm to approximately 1.0 nm, preferably 0.2 nm. The first metal layer 304 may be formed using physical vapor deposition (PVD), preferably sputter deposition using a metal source target. In one embodiment, the first metal layer 304 may be formed by PVD with a power of approximately 50 watts in an argon atmosphere with a pressure of 0.1 mTorr. Prior to depositing the first metal layer 304, the top surface of the interfacial layer 204 (or the substrate 202, if no interfacial layer is present) may be cleaned to remove any surface contaminants. In some embodiments, a plasma cleaning process may be used.

Figure 4:
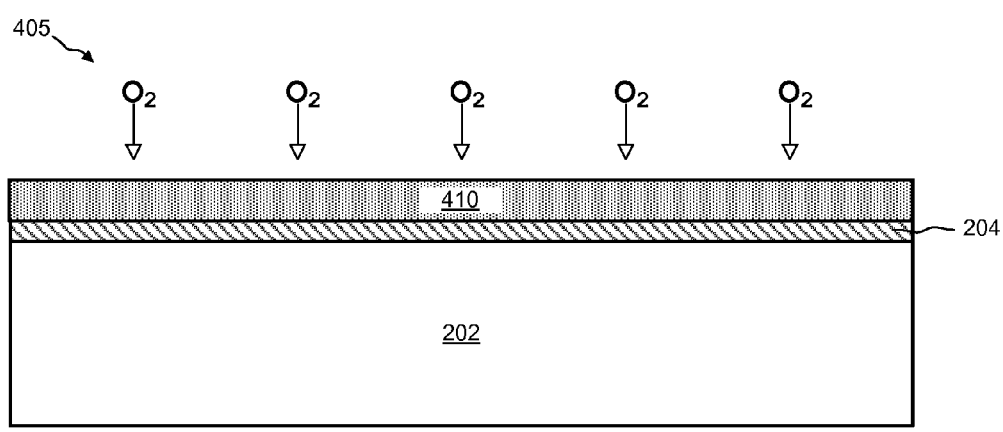
FIG. 4 is a cross-sectional front elevational view depicting oxidizing the first metal layer, according to an exemplary embodiment of the present invention.

At 106, described in conjunction with FIG. 4, the first metal layer 304 (FIG. 3) may be oxidized to convert the first metal layer 304 into a first dielectric sub-layer 410. The first metal layer 304 (FIG. 3) may be oxidized in a separate chamber, but to reduce the potential for contamination, the first metal layer 304 may be oxidized in situ, for example by flowing an oxygen source 405, for example, $O_2$ gas, into the deposition chamber (not shown) used at 104. In an exemplary embodiment, the first metal layer 304 may be oxidized at approximately room temperature (i.e., approximately 20° C.), with an $O_2$ gas flow rate of approximately 1 sccm to approximately 200 sccm for approximately 1 second to approximately 5 minutes. After oxidation, the thickness of the first dielectric sub-layer 410 may have a thickness of approximately 0.08 nm to approximately 1.0 nm, greater than the first metal layer 304. While depositing and oxidizing the first metal layer 304, oxygen may also migrate from the interfacial layer 204 into the first metal layer 304, reducing the thickness of the interfacial layer 204.

Figure 5:
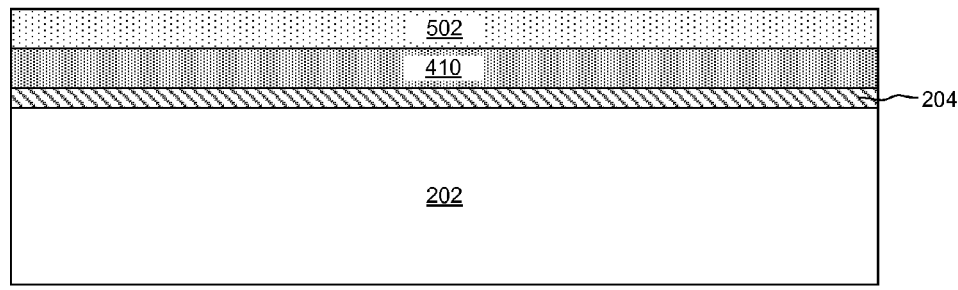
FIG. 5 is a cross-sectional front elevational view depicting depositing a second metal layer above the oxidized first metal layer, according to an exemplary embodiment of the present invention.

At 108, as described in conjunction with FIG. 5, a second metal layer 502 may be deposited above the first dielectric sub-layer 410. The second metal layer 502 may be made of any suitable metal material capable of forming a dielectric layer following oxidation including, for example, hafnium or titanium, and may have a thickness of approximately 0.08 nm to approximately 1.0 nm. The second metal layer 502 may be formed using physical vapor deposition, preferably sputter deposition. The second metal layer 502 may be made of the same or different material than the first metal layer 304 (FIG. 3) and have the same or different thickness. Where the first metal layer 304 is oxidized and the second metal layer 502 is deposited both in situ, the metal source target used for the PVD process may be cleaned to remove any oxidized layer that may have accumulated during the oxidation of the first metal layer 304. Where the first metal layer 304 is oxidized outside the deposition chamber, the metal source target may not be cleaned.

Figure 6:
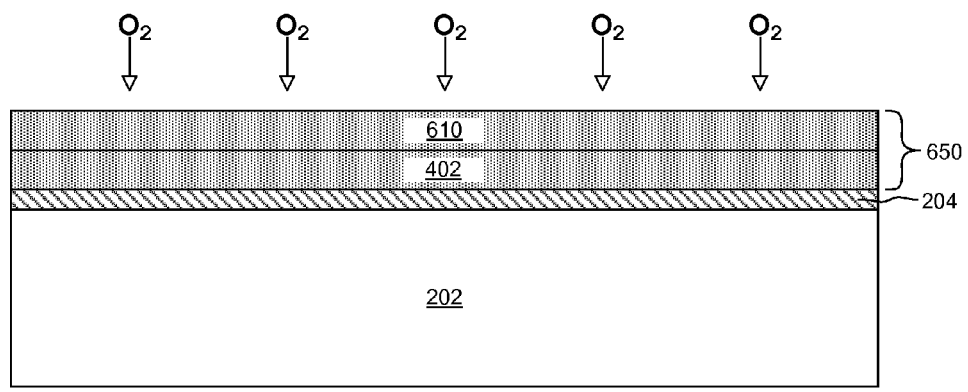
FIG. 6 is a cross-sectional front elevational view depicting oxidizing the second metal layer, according to an exemplary embodiment of the present invention.

At 110, as described in conjunction with FIG. 6, the second metal layer 502 may be oxidized to convert the second metal layer 502 into a second dielectric sub-layer 610. The second metal layer 502 may be oxidized using the same oxidation process described above at 108. In some embodiments, the oxidation process conditions may be altered to increase or decrease the oxygen content of the second dielectric sub-layer 610, for example by increasing or decreasing the $O_2$ gas flow rate or by increasing or decreasing the oxidation time. As a result, it may be possible to control the oxygen profile of the combined dielectric layer 650 by controlling the oxidation process of each individual dielectric sub-layer (e.g., the first dielectric sub-layer 410 and the second dielectric sub-layer 610).

Figure 7:
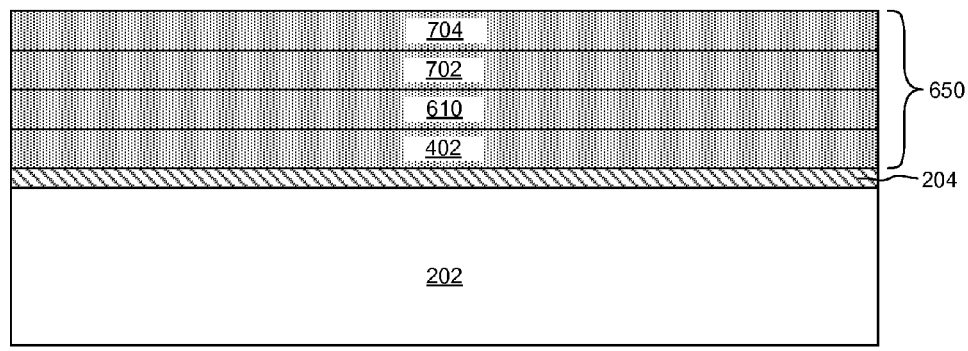
FIG. 7 is a cross-sectional front elevational view depicting forming additional oxidized metal layers above the first and second oxidized metal layers, according to an exemplary embodiment of the present invention.

At 112, as described in conjunction with FIG. 7, the thickness of the combined dielectric layer 650, made up of all dielectric sub-layers (e.g., first dielectric sub-layer 410, second dielectric sub-layer 610), may be measured or estimated and compared to the desired thickness. If the thickness of the combined dielectric layer 650 is less than the desired thickness, steps 108 and 110 may be repeated to form additional dielectric sub-layers, for example third dielectric sub-layers 702 and fourth dielectric sub-layers 704, and increase the total thickness of the combined dielectric layer 650. While FIG. 7 depicts the combined dielectric 650 after 4 total cycles of metal deposition and oxidation for illustrative purposes, the combined dielectric layer 650 may be formed using as few as two or many more than four cycles. The total thickness of the combined dielectric layer 650 will be determined by the thickness of each individual dielectric sub-layer and the number of cycles. In some embodiments, the combined dielectric layer 650 may have a thickness of approximately 0.5 nm to approximately 5.0 nm. As each dielectric sub-layer may have a thickness of approximately 0.1 nm to approximately 1.0 nm, each dielectric sub-layer may have a thickness of approximately 2% to approximately 50% of the thickness of the combined dielectric layer. For example, combined dielectric layer 650 may have a total thickness of approximately 1.5 nm to 1.6 nm and be formed from 8-19 cycles, where the thickness of each individual dielectric sub-layer has a thickness of approximately 0.08 nm to approximately 0.2 nm, as shown in Table 1 below:

TABLE 1

| Individual Dielectric Layer Thickness (nm) | Number of Cycles | Combined Dielectric Layer Thickness (nm) |
|---|---|---|
| 0.2 | 8 | 1.6 |
| 0.15 | 10 | 1.5 |
| 0.13 | 12 | 1.56 |
| 0.11 | 14 | 1.54 |
| 0.08 | 19 | 1.52 |

By repeating a process of depositing a very thin metal layer and then oxidizing the metal layer, it is possible to fabricate a high-k dielectric layer of any desired thickness using a PVD process while avoiding the trapped charges typically associated with PVD deposition of high-k dielectric layers. Furthermore, the thinness of the metal layer further allows oxidation to occur at room temperature, reducing the overall thermal budget of the fabrication process.

Figure 8:
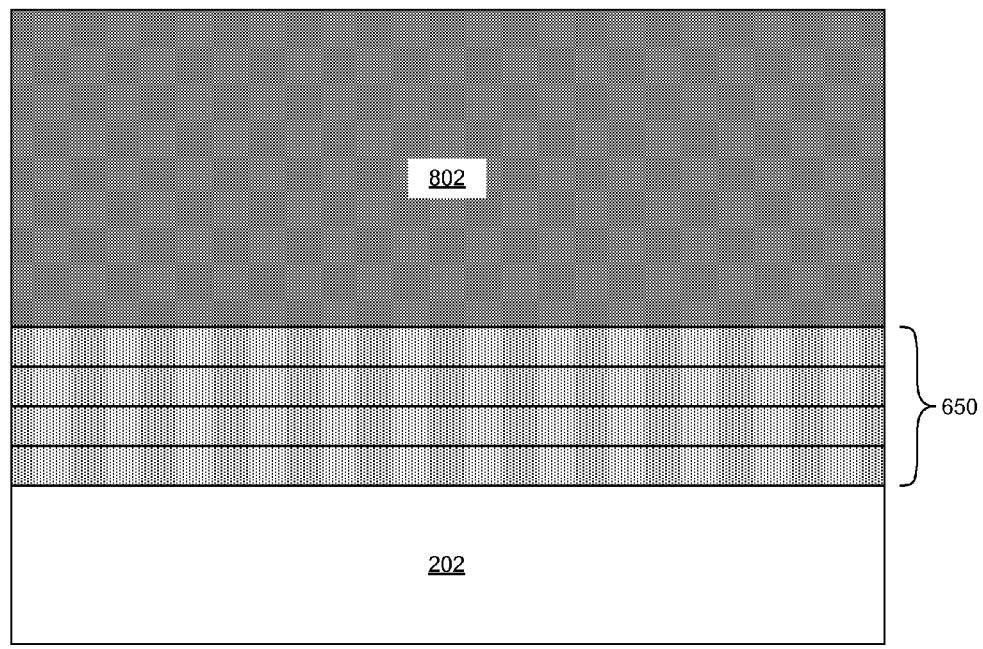
FIG. 8 is a cross-sectional front elevational view depicting forming a gate electrode layer above the plurality of oxidized metal layers, according to an embodiment of the present invention
Figure 9:
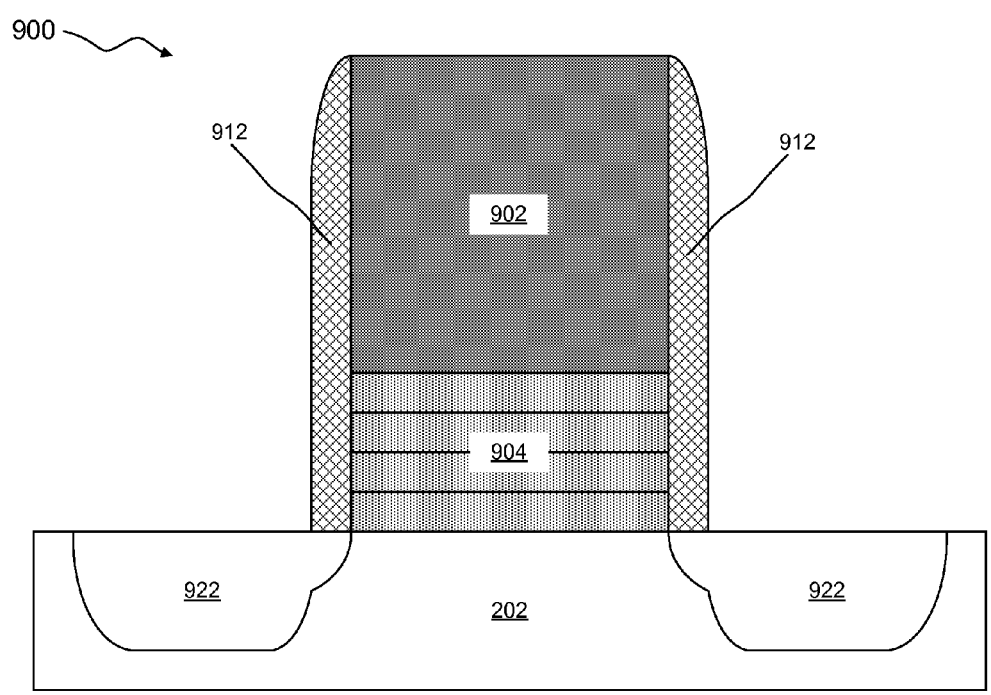
FIG. 9 is a cross-sectional front elevational view depicting forming a field effect transistor including the gate electrode layer and plurality of oxidized metal layers, according to an exemplary embodiment of the present invention.

At 114, described in conjunction with FIG. 8-9, once the combined dielectric layer 650 has reached the desired thickness, a field effect transistor 900 (FIG. 9) may be formed in and above the substrate 200 using known fabrication techniques. Referring to FIG. 8, a gate electrode layer 802 may be formed above the combined dielectric layer 650. The gate electrode layer 802 may be made of gate conductor materials including, but not limited to, Zr, W, Ta, Hf, Ti, Al, Ru, Pa, metal oxides, metal carbides, metal nitrides, transition metal aluminides (e.g. Ti3Al, ZrAl), TaC, TiC, TaMgC, or any combination of those materials. In an exemplary embodiment, the gate electrode layer 802 may be made of polysilicon. The gate electrode layer 802 may further include one or more low resistance gate capping layers such as TiN, W, Ti, Al, Ta, TaN, Co, TiC, TaC, Ni, or a combination thereof. Processes for forming gate electrodes are well-known in the art and other methods of forming the gate electrode layer 802 are explicitly contemplated. The gate electrode layer 802 may have a thickness of approximately 1 nm to approximately 50 nm.

Referring to FIG. 9, the gate electrode layer 802 and the combined dielectric layer 650 may be etched to form a gate electrode 902 and a gate dielectric 904, respectively. Spacers 912 may be formed on the sidewalls of the gate electrode 902 and the gate dielectric 904. The spacers 912 may be formed by depositing a conformal insulating layer, for example silicon nitride, over the gate electrode 902 and the gate dielectric 904 and using an anisotropic etching process to remove unwanted material. Methods of forming spacers are well-known in the art and other methods are explicitly contemplated. Further, in various embodiments, the spacers 912 may include one or more layers.

Source/drain regions 922 may then be formed in the substrate 202 adjacent to the gate dielectric 904. In one embodiment, source/drain regions 922 may be formed by doping the substrate 102. Dopants may include, for example, arsenic or phosphorus for nFET devices and boron for pFET devices. Dopant concentration may range from approximately $1\times10^{19}$ $cm^{-3}$ to approximately $2\times10^{21}$ $cm^{-3}$, preferably approximately $1\times10^{20}$ $cm^{-3}$ to approximately $1\times10^{21}$ $cm^{-3}$. Extension implants of dopants may be included to extend the source/drain regions 922 beneath the spacers 912. Other known methods of forming source/drain regions, including, for example, raised source/drain processes, are explicitly contemplated. While FIGS. 8-9 describe forming a planar transistor from the combined dielectric layer 650, it is explicitly contemplated that the dielectric deposition process described in conjunction with FIGS. 1-7 may be used to in conjunction with other fabrication processes or device types.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a dielectric layer, the method comprising:
    determining a desired thickness of the dielectric layer;
    forming a first dielectric sub-layer having a thickness less than the desired thickness, wherein forming the first dielectric sub-layer comprises depositing a first layer of metal atoms above an oxidized interfacial layer of a substrate using a physical vapor deposition process and oxidizing the first layer of metal atoms;
    forming n additional dielectric sub-layers, each of which having a thickness less than the desired thickness, above the first dielectric sub-layer so that a combined thickness of all dielectric sub-layers is approximately equal to the desired thickness, wherein n is a number greater than 1 and each of the additional dielectric sub-layers is formed by depositing an additional layer of metal atoms above the preceding dielectric sub-layer using a physical vapor deposition process and oxidizing the additional layer of metal atoms, and wherein at least one of the additional layer of metal atoms comprises a second metal different than the first layer of metal atoms; and
    tuning the overall conductivity of the dielectric layer by increasing or decreasing the oxygen content of the n additional dielectric sub-layers through the oxidization process.

2. The method of claim 1, where depositing the first metal layer and oxidizing the first metal layer occur in the same chamber.

3. The method of claim 1, wherein the first metal layer and the additional metal layers have a thickness of approximately 0.08 nm to approximately 1.0 nm such that they are substantially fully oxidized during the oxidizing step.

4. The method of claim 1, wherein the desired thickness is approximately 0.5 nm to approximately 5.0 nm.

5. The method of claim 1, wherein each of the dielectric sub-layers has a thickness ranging from approximately 2% to approximately 50% of the dielectric layer.

6. The method of claim 1, wherein n is less than 19.

7. The method of claim 1, wherein oxidizing the first metal layer and oxidizing the additional metal layers occurs at room temperature.

8. A method of forming a gate dielectric, the method comprising:
    determining a thickness appropriate for the gate dielectric;
    forming a first dielectric sub-layer by depositing a first layer of metal atoms above an oxidized interfacial layer of a substrate using physical vapor deposition and oxidizing the first layer of metal atoms;

forming another dielectric sub-layer above the first dielectric sub-layer by depositing another layer of metal atoms above the first dielectric sub-layer using physical vapor deposition and oxidizing the another layer of metal atoms;

determining if a total thickness of all dielectric sub-layers has reached the thickness appropriate for the gate dielectric;

if not, then repeating the above step of forming another dielectric sub-layer to form additional dielectric sub-layers until the total thickness of all dielectric sub-layers reaches the thickness appropriate for the gate dielectric, wherein at least one of the another layer of metal atoms comprises a second metal different than the first layer of metal atoms; and tuning the overall conductivity of the gate dielectric by increasing or decreasing the oxygen content of the n additional dielectric sub-layers through the oxidization process.

9. The method of claim 8, wherein depositing the first metal layer and oxidizing the first metal layer occur in the same chamber.

10. The method of claim 8, wherein the first metal layer and the another metal layer have a thickness of approximately 0.08 nm to approximately 1.0 nm.

11. The method of claim 8, the thickness appropriate for the gate dielectric is approximately 0.5 nm to approximately 5.0 nm.

12. The method of claim 8, wherein each of the dielectric sub-layers has a thickness of approximately 1.6% to approximately 50% of the gate dielectric.

13. The method of claim 8, wherein forming the another dielectric sub-layer is repeated up to 17 times.

14. The method of claim 8, wherein oxidizing the first metal layer and oxidizing the another metal layer occurs at room temperature.

15. A method of forming a transistor, the method comprising:

forming a gate dielectric layer above a substrate, wherein forming the gate dielectric layer comprises:
  determining a desired thickness of the gate dielectric layer,
  forming a first dielectric sub-layer having a thickness less than the desired thickness, wherein forming the first dielectric sub-layer comprises depositing a first layer of metal atoms above an oxidized interfacial layer of a substrate using physical vapor deposition and oxidizing the first metal layer, and
  forming n additional dielectric sub-layers above the first dielectric sub-layers so that a combined thickness of all dielectric sub-layers is approximately equal to the desired thickness, wherein n is a number greater than 1 and each of the additional dielectric sub-layers is formed by depositing an additional layer of metal atoms on the preceding dielectric sub-layer using physical vapor deposition and oxidizing the additional layer of metal atoms, and wherein at least one additional layer of metal atoms comprises a second metal different than the first layer of metal atoms;

tuning the overall conductivity of the dielectric layer by increasing or decreasing the oxygen content of the n additional dielectric sub-layers through the oxidization process;

forming a gate electrode layer above the gate dielectric layer;

etching the gate electrode layer and the gate dielectric layer to form a gate having sidewalls;

forming a spacer on the sidewalls of the gate; and forming a source/drain region in the substrate adjacent to the spacer.

16. The method of claim 15, wherein each of the dielectric sub-layers has a thickness ranging from approximately 2% to approximately 50% of the gate dielectric layer.

17. The method of claim 15, wherein n is less than 19.

* * * * *